United States Patent
Kim et al.

(10) Patent No.: US 11,856,825 B2
(45) Date of Patent: *Dec. 26, 2023

(54) ORGANIC LIGHT EMITTING DISPLAY DEVICE

(71) Applicant: SAMSUNG DISPLAY CO., LTD., Yongin-si (KR)

(72) Inventors: Taehyun Kim, Seoul (KR); Seungmin Lee, Hwaseong-si (KR); Seonyoung Choi, Gunpo-si (KR); Sangho Park, Hwaseong-si (KR); Donghwan Shim, Hwaseong-si (KR); Jungkyu Lee, Incheon (KR); Seunghwan Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 392 days.

This patent is subject to a terminal disclaimer.

(21) Appl. No.: 17/086,532

(22) Filed: Nov. 2, 2020

(65) Prior Publication Data

US 2021/0091330 A1  Mar. 25, 2021

Related U.S. Application Data

(63) Continuation of application No. 15/999,177, filed on Aug. 16, 2018, now Pat. No. 10,826,013.

(30) Foreign Application Priority Data

Sep. 14, 2017 (KR) .................. 10-2017-0117728

(51) Int. Cl.
*H10K 59/13* (2023.01)
*H01L 27/12* (2006.01)
(Continued)

(52) U.S. Cl.
CPC ........ *H10K 59/131* (2023.02); *H01L 27/1214* (2013.01); *H10K 50/131* (2023.02);
(Continued)

(58) Field of Classification Search
CPC ............... H01L 51/5044; H01L 51/525; H01L 51/5246; H01L 51/524; H01L 51/5203;
(Continued)

(56) References Cited

U.S. PATENT DOCUMENTS 8,049,412 B2   11/2011   Kwak
9,035,854 B2   5/2015   Lee et al.
(Continued)

FOREIGN PATENT DOCUMENTS

CN    103472650    12/2013
GB    2248341      4/1992
(Continued)

OTHER PUBLICATIONS

European Search Report issued in corresponding application No. 18194587.4 dated Feb. 12, 2019.

(Continued)

*Primary Examiner* — Thanhha S Pham
(74) *Attorney, Agent, or Firm* — F. Chau & Associates, LLC

(57) ABSTRACT

An OLED display device including: a substrate including a display area and a non-display area; an organic light emitting element including a first electrode, an organic light emitting layer on the first electrode, and a second electrode on the organic light emitting layer; a first conductive line at the non-display area of the substrate; a first organic layer on the first conductive line; a second conductive line on the first organic layer and connected to the first conductive line; a second organic layer on the second conductive line; and a third conductive line on the second organic layer and con-
(Continued)

nected to the second conductive line. The third conductive line is connected to the second electrode. The first electrode is at the display area of the substrate.

19 Claims, 6 Drawing Sheets

(51) Int. Cl.
*H10K 50/13* (2023.01)
*H10K 50/805* (2023.01)
*H10K 59/179* (2023.01)
*H10K 50/842* (2023.01)
*H10K 59/131* (2023.01)

(52) U.S. Cl.
CPC ....... *H10K 50/805* (2023.02); *H10K 59/1795* (2023.02); *H10K 50/8426* (2023.02)

(58) Field of Classification Search
CPC ............. H01L 27/3297; H01L 27/3276; H01L 27/1214; H10K 59/13; H10K 50/131; H10K 50/805; H10K 59/1795; H10K 50/8426; H10K 50/844; H10K 59/1213; H10K 50/8428; H10K 77/111; Y02E 10/549
See application file for complete search history.

(56) References Cited

U.S. PATENT DOCUMENTS

| | | |
|---|---|---|
| 2006/0060850 A1 | 3/2006 | Kwak et al. |
| 2015/0102299 A1 | 4/2015 | Hong |
| 2015/0102323 A1 | 4/2015 | Koshihara et al. |
| 2016/0035274 A1* | 2/2016 | Kwon .................. H01L 27/124 345/82 |
| 2017/0033173 A1 | 2/2017 | Kim |
| 2017/0133620 A1 | 5/2017 | Lee et al. |
| 2017/0148391 A1 | 5/2017 | Pyon |
| 2017/0237025 A1* | 8/2017 | Choi .................. H01L 27/3276 257/40 |
| 2018/0151838 A1* | 5/2018 | Park .................. H01L 27/3258 |
| 2019/0081270 A1 | 3/2019 | Kim et al. |

FOREIGN PATENT DOCUMENTS

| | | |
|---|---|---|
| KR | 10-2006-0059745 | 6/2006 |
| KR | 10-0897157 | 5/2009 |
| KR | 10-2012-0072948 | 7/2012 |
| KR | 10-2015-0043648 | 4/2015 |
| KR | 10-2015-0049640 | 5/2015 |
| KR | 10-2017-0015746 | 2/2017 |
| KR | 10-2017-0054665 | 5/2017 |

OTHER PUBLICATIONS

Chinese Office Action dated Dec. 23, 2022 issued in corresponding Chinese Patent Application No. 201811072151.2.

* cited by examiner

ORGANIC LIGHT EMITTING DISPLAY DEVICE

CROSS-REFERENCE TO RELATED APPLICATIONS

This application is a continuation of U.S. patent application Ser. No. 15/999,177 filed on Aug. 16, 2018, which claims priority under 35 U.S.C. § 119 to Korean Patent Application No. 10-2017-0117728, filed on Sep. 14, 2017, in the Korean Intellectual Property Office (KIPO), the disclosures of which are incorporated by reference herein in their entireties.

1. Technical Field

Exemplary embodiments of the present invention relate to an organic light emitting diode ("OLED") display device.

2. Discussion of Related Art

OLED display devices are self-light emitting display devices in that they do not use a backlight. For example, an OLED display device displays images using a plurality of light emitting OLEDs. The OLED display devices have various characteristics such as low power consumption, high luminance, high reaction speed, or the like.

There is an increasing demand for OLED display devices having large size, high resolution, and excellent display quality. Research is currently underway to develop such OLED display devices. Additional research is being carried out to reduce planar areas of a non-display area and a bezel, and to increase image size on screens of OLED display devices.

Summary

According to an exemplary embodiment of the present invention, an organic light emitting display device includes: a substrate including a display area and a non-display area; an organic light emitting element including a first electrode, an organic light emitting layer on the first electrode, and a second electrode on the organic light emitting layer; a first conductive line at the non-display area of the substrate; a first organic layer on the first conductive line; a second conductive line on the first organic layer and connected to the first conductive line; a second organic layer on the second conductive line; and a third conductive line on the second organic layer and connected to the second conductive line. The third conductive line is connected to the second electrode. The first electrode is at the display area of the substrate.

The first conductive line, the second conductive line, and the third conductive line may constitute a link line.

The first organic layer may have a first contact hole. The second organic layer may have a second contact hole. The second conductive line may be connected to the first conductive line through the first contact hole. The third conductive line may be connected to the second conductive line through the second contact hole.

The organic light emitting display device may further include a spacer on the third conductive line.

The spacer may include a plurality of layers.

The third conductive line may have a plurality of holes at an area between the second conductive line and the spacer.

Each of the plurality of holes between the second conductive line and the spacer may have a diameter from about 1 µm to about 5 µm.

The third conductive line may have a plurality of holes at an area overlapping the first organic layer and the second organic layer.

Each of the plurality of holes overlapping the first and second organic layers may have a diameter from about 1 µm to about 5 µm.

The organic light emitting display device may further include an inorganic layer between the first conductive line and the first organic layer.

The organic light emitting display device may further include an inorganic layer between the first organic layer and the second conductive line.

The organic light emitting display device may further include a gate line and a data line on the substrate; a thin film transistor connected to the gate line and the data line; a first auxiliary electrode overlapping the thin film transistor and connected to the thin film transistor; and a second auxiliary electrode between the first auxiliary electrode and the first electrode. The second auxiliary electrode may be connected to each of the first auxiliary electrode and the first electrode.

The first conductive line and the first auxiliary electrode may be disposed on the same layer as each other.

The second conductive line and the second auxiliary electrode may be disposed on the same layer as each other, and the third conductive line and the first electrode may be disposed on the same layer as each other.

The organic light emitting display device may further include a common power line parallel to the data line. The common power line may include a first power line and a second power line.

The first power line, the first conductive line and the first auxiliary electrode may be disposed on the same layer as each other. The second power line, the second conductive line and the second auxiliary electrode may be disposed on the same layer as each other.

The organic light emitting display device may further include a thin film encapsulation layer on the second electrode and the third conductive line. The thin film encapsulation layer may include: an inorganic layer; and an organic layer.

The substrate may include a bendable portion.

According to an exemplary embodiment of the present invention, an organic light emitting display device includes: a substrate including a display area and a non-display area; an organic light emitting element including a first electrode, an organic light emitting layer on the first electrode, and a second electrode on the organic light emitting layer; a first conductive line at the non-display area of the substrate; a first organic layer on the first conductive line; a second conductive line on the first organic layer and connected to the first conductive line; a second organic layer on the second conductive line; a third conductive line on the second organic layer and connected to the second conductive line; and a spacer on the third conductive line. The third conductive line has a plurality of first holes at an area overlapping the second conductive line and the spacer. The first electrode is at the display area of the substrate.

The third conductive line may have a plurality of second holes at an area overlapping the first organic layer and the second organic layer.

Each of the plurality of first holes and the plurality of second holes may have a diameter from about 1 µm to about 5 µm.

The third conductive line may be connected to the second electrode.

According to an exemplary embodiment of the present invention, an organic light emitting display device includes: an organic light emitting diode, the organic light emitting diode including a second electrode in a non-display area; and a link line including first, second and third conductive lines sequentially stacked in the non-display area. The second electrode of the organic light emitting diode in the non-display area is directly on the third conductive line.

The organic light emitting diode may include a first electrode in a display area, the first electrode being directly on a second organic layer in the display area.

The third conductive line may be directly connected to the second conductive line through an opening in the second organic layer in the non-display area, and the second conductive line may be directly connected to the first conductive line through an opening in a first organic layer in the non-display area.

BRIEF DESCRIPTION OF THE DRAWINGS

The above and other features of the present invention will become more apparent by describing in detail exemplary embodiments thereof with reference to the accompanying drawings, wherein.

DETAILED DESCRIPTION OF THE EMBODIMENTS

Figure 1:
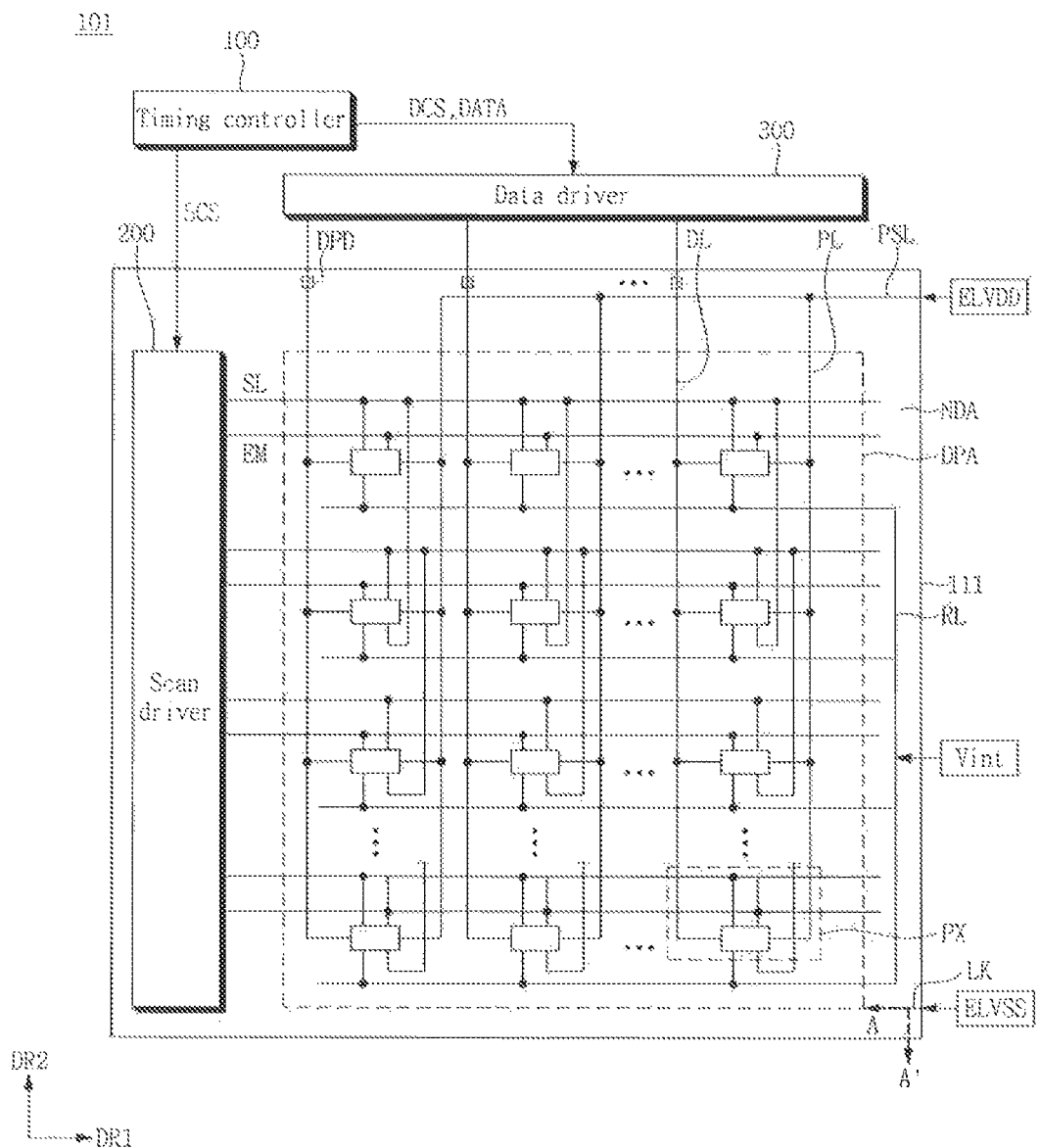
FIG. 1 is a block diagram illustrating an organic light emitting diode ("OLED") display device according to an exemplary embodiment of the present invention.

Exemplary embodiments of the present invention will now be described more fully hereinafter with reference to the accompanying drawings. The present invention may, however, be embodied in many different forms and should not be construed as being limited to the exemplary embodiments set forth herein.

In the drawings, thicknesses of a plurality of layers and areas may be illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween.

Throughout the specification, when an element is referred to as being "connected" to another element, the element may be "directly connected" to the other element, or "electrically connected" to the other element with one or more intervening elements interposed therebetween.

"About" or "approximately" as used herein may be inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations, or within ±30%, 20%, 10%, or 5% of the stated value.

Hereinafter, an exemplary embodiment of the present invention will be described with reference to FIGS. 1 to 7.

FIG. 1 is a block diagram illustrating an organic light emitting diode ("OLED") display device 101 according to an exemplary embodiment of the present invention.

Referring to FIG. 1, the OLED display device 101 is divided into a display area DPA and a non-display area NDA, and includes a timing controller 100, a scan driver 200, a data driver 300, and a plurality of pixels PX.

The timing controller 100 receives input image signals and generates image data DATA. In addition, the timing controller 100 outputs the image data DATA and various control signals DCS and SCS.

The scan driver 200 receives a gate control signal SCS from the timing controller 100. The gate control signal SCS may include a vertical start signal for starting an operation of the scan driver 200, a clock signal for determining an output timing of the signals to be output from the scan driver 200, and the like. The scan driver 200 generates a plurality of scan signals and sequentially outputs the plurality of scan signals to a plurality of gate lines SL. In addition, the scan driver 200 generates a plurality of emission control signals in response to the gate control signal SCS and outputs the plurality of emission control signals to a plurality of emission control lines EM.

FIG. 1 shows that the plurality of scan signals and the plurality of emission control signals are output from one scan driver 200, but exemplary embodiments of the present invention are not limited thereto. In an exemplary embodiment of the present invention, a plurality of scan drivers may be used to divide and output a plurality of scan signals and divide and output a plurality of emission control signals. In addition, in an exemplary embodiment of the present invention, there may be provided a driver for generating and outputting the plurality of scan signals and a driver for generating and outputting the plurality of emission control signals.

The data driver 300 receives a data control signal DCS and the image data DATA from the timing controller 100. The data driver 300 converts the image data DATA into data signals and outputs the data signals to a plurality of data lines DL. A data signal may be an analog voltage corresponding to a gray level value of the image data DATA. The data driver 300 may be connected to the data lines DL disposed on substrate 111 through a terminal DPD at one end portion of the substrate 111.

The plurality of gate lines SL, the plurality of emission control lines EM, the plurality of data lines DL, and a plurality of pixels PX are arranged on the substrate 111 in the display area DPA. The plurality of gate lines SL extends in a first direction DR1, and is arranged along a second direction DR2 which crosses the first direction DR1. Each of the plurality of emission control lines EM may be arranged in parallel to a corresponding one of the plurality of gate lines SL. The plurality of data lines DL are insulated from and cross the plurality of gate lines SL.

The pixel PX is connected to at least one of the gate lines SL, one of the emission control lines EM, and one of the data lines DL. The pixel PX receives a first voltage ELVDD and a second voltage ELVSS which has a level less than a level of the first voltage ELVDD. The pixel PX is connected to a common power line PL that applies the first voltage ELVDD and an initialization line RL that receives an initialization voltage Vint. The common power line PL receives the first voltage ELVDD through a common power supply line PSL at the non-display area NDA. The first voltage ELVDD may also be referred to as a common voltage. In addition, the pixel PX receives the second voltage ELVSS through a second electrode PE2 of the OLED to be described below with reference to FIGS. 5, 6, and 7. The second electrode PE2 receives the second voltage ELVSS through a link line LK at the non-display area NDA, which will be described in detail below.

One pixel PX may be electrically connected to two gate lines SL. As illustrated in FIG. 1, pixels PX connected to a second gate line (hereinafter, pixels of a second pixel row) may also be connected to a first gate line. The pixels PX of the second pixel row receive a scan signal applied to the second gate line and a scan signal applied to the first gate line.

The pixel PX may include a red pixel which emits red, a green pixel which emits green, and a blue pixel which emits blue. The OLED of the red pixel, the OLED of the green pixel, and the OLED of the blue pixel may include organic light emitting layers each including different materials, respectively. The pixel PX includes a circuit portion for controlling light emission of the OLED. The circuit portion may include a plurality of thin film transistors and a capacitor, which will be described in detail below.

The plurality of gate lines SL, the plurality of emission control lines EM, the plurality of data lines DL, the common power line PL, the initialization line RL, the common power supply line PSL, the link line LK, and the plurality of pixels PX may be formed on the substrate 111 through a plurality of patterning processes. In addition, a plurality of insulating layers may be formed on the substrate 111 through a plurality of deposition or coating processes. Each insulating layer may include at least one of an organic layer and an inorganic layer.

Figure 2:
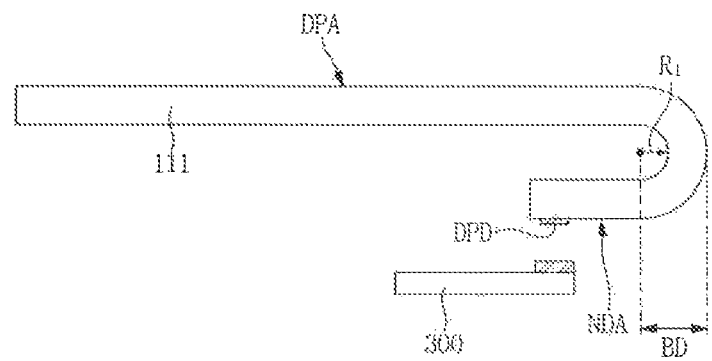
FIG. 2 is a cross-sectional view illustrating a case in which a substrate according to an exemplary embodiment of the present invention is bent.

FIG. 2 is a cross-sectional view illustrating a case in which the substrate 111 is bent.

The substrate 111 includes at least one bending portion BD. For example, the bending portion BD may be located at the display area DPA. In addition, the bending portion BD may be located at the non-display area NDA adjacent to the scan driver 200, and may be located at the non-display area NDA adjacent to the data driver 300. In addition, the bending portion BD may be disposed at all four edges, surrounding the display area DPA.

The substrate 11 has flexible characteristics and is capable of being bent 180 degrees, as illustrated in FIG. 2. The substrate 111 may include, for example, a plastic film, The OLED display device 101 according to an exemplary embodiment of the present invention includes a terminal DPD at one end portion of the substrate 111. Various driving means may be connected to various signal lines on the substrate 111 through the terminal DPD. For example, the data driver 300 may be connected to the data line DL on the substrate 111 through the terminal DPD at one end portion of the substrate 111.

Referring to FIG. 2, the substrate 111 may be bent at the bending portion BD to overlap a portion of the substrate 111. In other words, one end portion of the substrate 111 including the terminal DPD may be disposed on a back surface of the display area DPA. As described above, since a portion of the substrate 111 is bent so that the terminal DPD is disposed on the back surface or back side of the display area DPA, the OLED display device 101 including a narrow bezel may be manufactured.

According to an exemplary embodiment of the present invention, when the substrate 111 is bent, an inner radius of curvature R1 of the bending portion BD may be about 1,000 μm or less. For example, when the substrate 111 is bent, the inner radius of curvature R1 of the bending portion BD may be in a range from about 0 μm to about 500 μm. When a thin type substrate 111 with high flexibility is used, in a case that the substrate 111 is bent, an inner radius of curvature R1 of the bending portion BD may be in a range from about 0 μm to about 50 μm. For example, when a transparent polymer film is used as the thin type substrate 111, in a case that the substrate 111 is bent, the inner radius of curvature R1 of the bending portion BD may be in a range from about 0.1 μm to about 50 μm.

Figure 3:
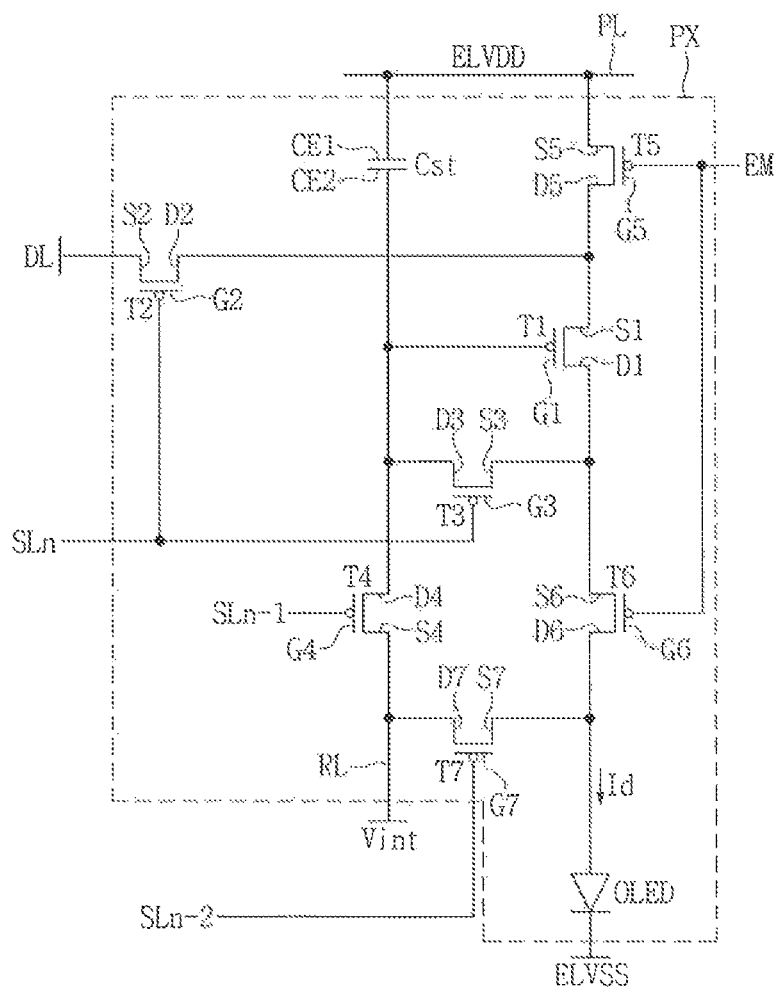
FIG. 3 is a circuit diagram illustrating a pixel of an OLED display device according to an exemplary embodiment of the present invention.

FIG. 3 is a circuit diagram illustrating a pixel of the OLED display device 101 according to an exemplary embodiment of the present invention.

Referring to FIG. 3, one pixel PX of the OLED display device 101 according to an exemplary embodiment of the present invention includes a plurality of thin film transistors T1, T2, T3, T4, T5, T6, and T7, a plurality of wirings SLn, SLn-1, SLn-2, EM, Vint, DL, and PL selectively connected to the plurality of thin film transistors T1, T2, T3, T4, T5, T6, and T7, a capacitor Cst, and an organic light emitting diode ("OLED").

The plurality of thin film transistors T1, T2, T3, T4, T5, T6, and T7 include a first thin film transistor T1, a second thin film transistor T2, a third thin film transistor T3, a fourth thin film transistor T4, a fifth thin film transistor T5, a sixth thin film transistor T6, and a seventh thin film transistor T7.

A first gate electrode G1 of the first thin film transistor T1 is connected to a third drain electrode D3 of the third thin film transistor T3 and a fourth drain electrode D4 of the fourth thin film transistor T4. A first source electrode S1 of the first thin film transistor T1 is connected to a second drain electrode D2 of the second thin film transistor T2 and a fifth drain electrode D5 of the fifth thin film transistor T5. A first drain electrode D1 of the first thin film transistor T1 is connected to a third source electrode S3 of the third thin film transistor T3 and a sixth source electrode S6 of the sixth thin film transistor T6.

A second gate electrode G2 of the second thin film transistor T2 is connected to a first gate line SLn, a second source electrode S2 of the second thin film transistor T2 is connected to the data line DL, and the second drain electrode D2 of the second thin film transistor T2 is connected to the first source electrode S1 of the first thin film transistor T1 and the fifth drain electrode D5 of the fifth thin film transistor T5.

A third gate electrode G3 of the third thin film transistor T3 is connected to the first gate line SLn, the third source electrode S3 of the third thin film transistor T3 is connected to the first drain electrode D1 of the first thin film transistor T1 and the sixth source electrode S6 of the sixth thin film transistor T6, and the third drain electrode D3 of the third thin film transistor T3 is connected to the first gate electrode G1 of the first thin film transistor T1 and the fourth drain electrode D4 of the fourth thin film transistor T4.

A fourth gate electrode G4 of the fourth thin film transistor T4 is connected to a second gate line SLn-1, a fourth source electrode S4 of the fourth thin film transistor T4 is connected to the initialization line RL, and the fourth drain electrode D4 of the fourth thin film transistor T4 is connected to the first gate electrode G1 of the first thin film transistor T1 and the third drain electrode D3 of the third thin film transistor T3. An initialization voltage Vint is applied through the initialization line RL.

A fifth gate electrode G5 of the fifth thin film transistor T5 is connected to the emission control line EM, a fifth source electrode S5 of the fifth thin film transistor T5 is connected to the common power line PL, and the fifth drain electrode D5 of the fifth thin film transistor T5 is connected to the first source electrode S1 of the first thin film transistor T1 and the second drain electrode D2 of the second thin film transistor T2.

Figure 5:
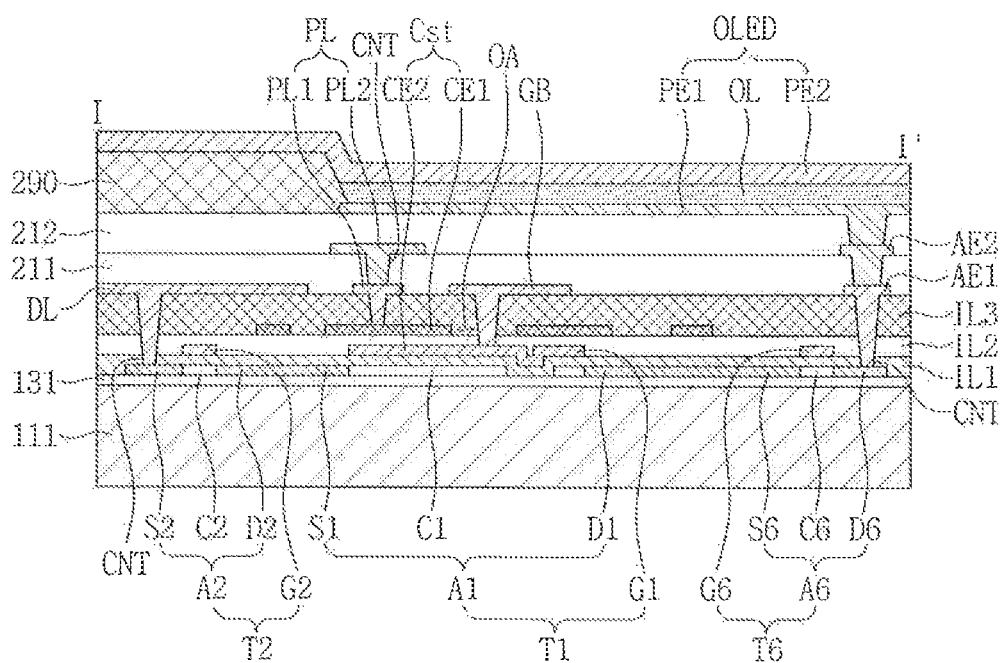
FIG. 5 is a cross-sectional view taken along line I-I' of FIG. 4.

A sixth gate electrode G6 of the sixth thin film transistor T6 is connected to the emission control line EM, and the sixth source electrode S6 of the sixth thin film transistor T6 is connected to the first drain electrode D1 of the first thin film transistor T1 and the third source electrode S3 of the third thin film transistor T3. A sixth drain electrode D6 of the sixth thin film transistor T6 is connected to a first electrode PE1 of the OLED. The first electrode PE1 may be a pixel electrode. The first electrode PE1 is illustrated in FIG. 5, for example.

A seventh gate electrode G7 of the seventh thin film transistor T7 is connected to a third gate line SLn-2, a seventh source electrode S7 of the seventh thin film transistor T7 is connected to the OLED, and a seventh drain electrode D7 of the seventh thin film transistor T7 is connected to the initialization line RL and the fourth source electrode S4 of the fourth thin film transistor T4.

As such, signal lines for transmitting scan signals include the first gate line SLn for transmitting a first scan signal to each of the second gate electrode G2 of the second thin film transistor T2 and the third gate electrode G3 of the third thin film transistor T3, the second gate line SLn-1 for transmitting a second scan signal to the fourth gate electrode G4 of the fourth thin film transistor T4, the third gate line SLn-2 for transmitting a third scan signal to the seventh gate electrode G7 of the seventh thin film transistor T7, and the emission control line EM for transmitting an emission control signal to each of the fifth gate electrode G5 of the fifth thin film transistor T5 and the sixth gate electrodes G6 of the sixth thin film transistor T6.

The capacitor Cst includes a first electrode CE1 connected to the common power line PL and a second electrode CE2 connected to the first gate electrode G1 of the first thin film transistor T1, the third drain electrode D3 of the third thin film transistor T3, and the fourth drain electrode D4 of the fourth thin film transistor T4.

The OLED includes a first electrode PE1, a second electrode PE2 on the first electrode PE1, and an organic light emitting layer OL between the first electrode PE1 and the second electrode PE2 (see FIG. 5). The first electrode PE1 of the OLED is connected to each of the seventh source electrode S7 of the seventh thin film transistor T7 and the sixth drain electrode D6 of the sixth thin film transistor T6. The second voltage ELVSS is applied through the second electrode PE2.

Hereinafter, an operation of the pixel PX will be described by way of example.

First, when the third scan signal is transmitted to the third gate line SLn-2 and the seventh thin film transistor T7 is turned on, a residual current flowing through the first electrode PE1 of the OLED is discharged to the fourth thin film transistor T4 through the seventh thin film transistor T7. Therefore, unintended light emission of the OLED due to the residual current flowing through the first electrode PE1 of the OLED may be suppressed.

Next, when the second scan signal is transmitted to the second gate line SLn-1 and the initialization signal is transmitted to the initialization line RL, the fourth thin film transistor T4 is turned on and the initialization voltage Vint based on the initialization signal is applied to the first gate electrode G1 of the first thin film transistor T1 and the second electrode CE2 of the capacitor Cst through the fourth thin film transistor T4. Therefore, the first gate electrode G1 and the capacitor Cst are initialized. In this case, the first gate electrode G1 is initialized and the first thin film transistor T1 is turned on.

Subsequently, when the first scan signal is transmitted to the first gate line SLn and the data signal is transmitted to the data line DL, each of the second thin film transistor T2 and the third thin film transistor T3 is turned on and a data voltage Vd based on the data signal is applied to the first gate electrode G1 through the second thin film transistor T2, the first thin film transistor T1, and the third thin film transistor T3.

In the present exemplary embodiment, a voltage applied to the first gate electrode G1 is a compensation voltage Vd+Vth, wherein Vth has a negative (−) value, which is obtained by subtracting a threshold voltage Vth of the first thin film transistor T1 from the data voltage Vd applied from an initial data line DL. The compensation voltage Vd+Vth, which is applied to the first gate electrode G1, is also applied to the second electrode CE2 of the capacitor Cst connected to the first gate electrode G1.

Next, a driving voltage based on a driving signal is applied from the common power line PL to the first electrode CE1 of the capacitor Cst and the compensation voltage Vd+Vth is applied to the second electrode CE2. Therefore, electric charges corresponding to a difference between the voltages applied to opposite electrodes of the capacitor Cst are stored in the capacitor Cst, and thus, the first thin film transistor T1 is turned on for a predetermined time.

Next, when the emission control signal is applied to the emission control line EM, each of the fifth thin film transistor T5 and the sixth thin film transistor T6 is turned on. Therefore, the driving voltage based on the driving signal from the common power line PL is applied to the first thin film transistor T1 through the fifth thin film transistor T5.

In the present exemplary embodiment, since the driving voltage passes through the first thin film transistor T1 which is turned on by the capacitor Cst, a driving current td flows through the first drain electrode D1 of the first thin film transistor T1, and the driving current Id is applied to the OLED through the sixth thin film transistor T6. Therefore, the OLED emits light for a predetermined period of time. It is to be understood that the driving current Id corresponds to a difference between the driving voltage and a voltage applied to the first gate electrode G1 by the capacitor Cst.

The configuration of the pixel PX of the OLED display device 101 described above with reference to FIG. 3 is not limited thereto. For example, the pixel PX of the OLED display device 101 may include wirings of a plurality of thin film transistors, one or more capacitors, one or more gate lines, and one or more driving power lines.

Figure 4:
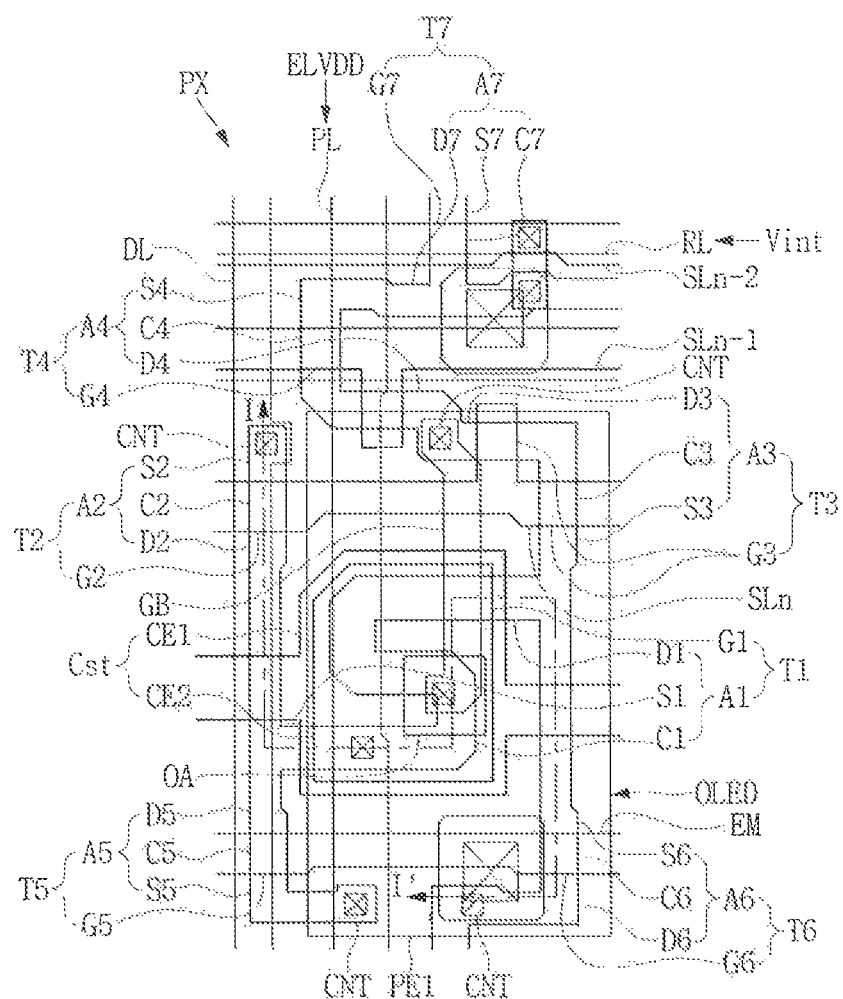
FIG. 4 is a plan view illustrating a pixel of an OLED display device according to an exemplary embodiment of the present invention.

FIG. 4 is a plan view illustrating a pixel of an OLED display device according to an exemplary embodiment of the present invention, and FIG. 5 is a cross-sectional view taken along line I-I' of FIG. 4.

Referring to FIGS. 4 and 5, a pixel PX on the substrate 111 includes the first thin film transistor T1, the second thin film transistor T2, the third thin film transistor T3, the fourth thin film transistor T4, the fifth thin film transistor T5, the sixth thin film transistor T6, the seventh thin film transistor T7, the first gate line SLn, the second gate line SLn-1, the third gate line SLn-2, the emission control line EM, the capacitor Cst, the data line DL, the common power line PL, a gate bridge GB, the initialization line RL, and the OLED.

A buffer layer 131 is located on the substrate 111. The buffer layer 131 serves to substantially prevent permeation of undesirable elements and to planarize a surface therebelow. The buffer layer 131 may include materials for preventing permeation of undesirable elements. The buffer layer 131 may also include elements that contribute to planarizing a surface thereunder. For example, the buffer layer 131 may include one of the following: a silicon nitride ($SiN_x$) layer, a silicon oxide ($SiO_2$) layer, and a silicon oxynitride ($SiO_xN_y$) layer. However, the buffer layer 131 may not be needed depending on the type of the substrate 111 and the process conditions of the substrate 111.

The first thin film transistor T1 is located on the substrate 111 and includes a first active layer A1 and the first gate electrode G1.

The first active layer A1 includes the first source electrode S1, a first channel C1, and the first drain electrode D1. The first source electrode S1 is connected to each of the second drain electrode D2 of the second thin film transistor T2 and the fifth drain electrode D5 of the fifth thin film transistor T5, and the first drain electrode D1 is connected to each of the third source electrode S3 of the third thin film transistor T3 and the sixth source electrode S6 of the sixth thin film transistor T6. The first channel C1, which is a channel area of the first active layer A1 overlapping the first gate electrode G1, is bent and extends at least once (see FIG. 4). The first active layer A1 may include polysilicon or an oxide semiconductor. The oxide semiconductor may include at least one selected from the group consisting of: oxides based on titanium (Ti), hafnium (Hf), zirconium (Zr), aluminum (Al), tantalum (Ta), germanium (Ge), zinc (Zn), gallium (Ga), tin (Sn), and/or indium (In), and/or composite oxides thereof such as zinc oxide (ZnO), indium-gallium-zinc oxide (InGaZnO4), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—C), indium-tin-aluminum oxide (In—Sn—Al—O), indium-aluminum-galium oxide (In—Al—Ga—C), indium-tantalum oxide (In—Ta—C), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O). When the first active layer A1 includes an oxide semiconductor, an additional protective layer may be added to protect the oxide semiconductor from an external environment, e.g., a high temperature.

The first channel C1 of the first active layer A1 may be channel-doped with N-type impurities or P-type impurities. Each of the first source electrode S1 and the first drain electrode D1 may be spaced apart from each other with the first channel C1 therebetween. Each of the first source electrode S1 and the first drain electrode D1 may be doped with doping impurities having a type opposite to a type of doping impurities used to dope the first channel C1.

The first gate electrode G1 may be located on the first channel C1 of the first active layer A1 and may have an island shape. The first gate electrode G1 is electrically connected to the fourth drain electrode D4 of the fourth thin film transistor T4 and the third drain electrode D3 of the third thin film transistor T3 by the gate bridge GB passing through one of a plurality of contact holes CNT. The first gate electrode G1 overlaps the first electrode CE1 of the capacitor Cst. The first gate electrode G1 may serve as a gate electrode of the first thin film transistor T1 and also serve as the second electrode CE2 of the capacitor Cst. In other words, the first gate electrode G1 forms the capacitor Cst together with the first electrode CE1 of the capacitor Cst.

The second thin film transistor T2 is located on the substrate 111 and includes a second active layer A2 and the second gate electrode G2.

The second active layer A2 includes the second source electrode S2, a second channel C2, and the second drain electrode D2. The second source electrode S2 is connected to the data line DL through one of the contact holes CNT (left side contact hole in FIG. 5), and the second drain electrode D2 is connected to the first source electrode S1 of the first thin film transistor T1. The second channel C2, which is a channel area of the second active layer A2 overlapping the second gate electrode G2, is located between the second source electrode S2 and the second drain electrode D2. In other words, the second active layer A2 is connected to the first active layer A1.

The second channel C2 of the second active layer A2 may be channel-doped with N-type impurities or P-type impurities. Each of the second source electrode S2 and the second drain electrode D2 may be spaced apart from each other with the second channel C2 therebetween. Each of the second source electrode S2 and the second drain electrode D2 may be doped with doping impurities having a type opposite to a type of doping impurities used to dope the second channel C2. The second active layer A2 is located on a layer substantially the same as a layer on which the first active layer A1 is located, includes a material substantially the same as a material included in the first active layer A1, and is formed unitarily with the first active layer A1.

The second gate electrode G2 is located on the second channel C2 of the second active layer A2 and is formed unitarily with the first gate line SLn.

The third thin film transistor T3 is located on the substrate 111 and includes a third active layer A3 and the third gate electrode G3.

The third active layer A3 includes the third source electrode S3, a third channel C3, and the third drain electrode D3. The third source electrode S3 is connected to the first drain electrode D1, and the third drain electrode D3 is connected to the first gate electrode G1 of the first thin film transistor T1 by the gate bridge GB passing through one of the contact holes CNT. The third channel C3, which is a channel area of the third active layer A3 overlapping the third gate electrode G3, is located between the third source electrode S3 and the third drain electrode D3.

The third active layer A3 is connected between the first active layer A1 and the first gate electrode G1.

The third channel C3 of the third active layer A3 may be channel-doped with N-type impurities or P-type impurities. Each of the third source electrode S3 and the third drain electrode D3 may be spaced apart from each other with the third channel C3 therebetween. Each of the third source electrode S3 and the third drain electrode D3 may be doped with doping impurities having a type opposite to a type of doping impurities used to dope the third channel C3. The third active layer A3 is located on a layer substantially the same as a layer on which the first active layer A1 and the second active layer A2 are located, includes a material substantially the same as a material included in the first active layer A1 and the second active layer A2, and is formed unitarily with the first active layer A1 and the second active layer A2.

The third gate electrode G3 is located on the third channel C3 of the third active layer A3 and is formed unitarily with the first gate line SLn. The third gate electrode G3 is formed as a dual gate electrode.

The fourth thin film transistor T4 is located on the substrate 111 and includes a fourth active layer A4 and the fourth gate electrode G4.

The fourth active layer A4 includes the fourth source electrode S4, a fourth channel C4, and the fourth drain electrode D4. The fourth source electrode S4 is connected to the initialization line RL through one of the contact holes CNT, and the fourth drain electrode D4 is connected to the first gate electrode G of the first thin film transistor T1 by the gate bridge GB passing through one of the contact holes CNT. The fourth channel C4, which is a channel area of the fourth active layer A4 overlapping the fourth gate electrode G4, is located between the fourth source electrode S4 and the fourth drain electrode D4. In other words, the fourth active layer A4 is connected between the initialization line RL and the first gate electrode G1, and is connected to each of the third active layer A3 and the first gate electrode G1.

The fourth channel C4 of the fourth active layer A4 may be channel-doped with N-type impurities or P-type impurities. Each of the fourth source electrode S4 and the fourth drain electrode D4 may be spaced apart from each other with the fourth channel C4 therebetween. Each of the fourth source electrode S4 and the fourth drain electrode D4 may be doped with doping impurities having a type opposite to a type of doping impurities used to dope the fourth channel C4. The fourth active layer A4 is located on a layer substantially the same as a layer on which the first active layer A1, the second active layer A2, and the third active layer A3 are located, includes a material substantially the same as a material included in the first active layer A1, the second active layer A2, and the third active layer A3, and is formed unitarily with the first active layer A1, the second active layer A2, and the third active layer A3.

The fourth gate electrode G4 is located on the fourth channel C4 of the fourth active layer A4 and is formed unitarily with the second gate line SLn-1. The fourth gate electrode G4 is formed as a dual gate electrode.

The fifth thin film transistor T5 is located on the substrate 111 and includes a fifth active layer A5 and the fifth gate electrode G5.

The fifth active layer A5 includes the fifth source electrode S5, a fifth channel C5, and the fifth drain electrode D5. The fifth source electrode S5 is connected to the common power line PL through one of the contact holes CNT, and the fifth drain electrode D5 is connected to the first source electrode S1 of the first thin film transistor T1. The fifth channel C5, which is a channel area of the fifth active layer A5 overlapping the fifth gate electrode G5, is located between the fifth source electrode S5 and the fifth drain electrode D5. In other words, the fifth active layer A5 is connected between the common power line PL for applying the first voltage ELVDD and the first active layer A1.

The fifth channel C5 of the fifth active layer A5 may be channel-doped with N-type impurities or P-type impurities. Each of the fifth source electrode S5 and the fifth drain electrode D5 may be spaced apart from each other with the fifth channel C5 therebetween. Each of the fifth source electrode S5 and the fifth drain electrode D5 may be doped with doping impurities having a type opposite to a type of doping impurities used to dope the fifth channel C5. The fifth active layer A5 is located on a layer substantially the same as a layer on which the first active layer A1, the second active layer A2, the third active layer A3, and the fourth active layer A4 are located, includes a material substantially the same as a material included in the first active layer A1, the second active layer A2, the third active layer A3, and the fourth active layer A4, and is formed unitarily with the first active layer A1, the second active layer A2, the third active layer A3, and the fourth active layer A4.

The fifth gate electrode G5 is located on the fifth channel C5 of the fifth active layer A5 and is formed unitarily with the emission control line EM.

The sixth thin film transistor T6 is located on the substrate 111 and includes a sixth active layer A6 and the sixth gate electrode G6.

The sixth active layer A6 includes the sixth source electrode S6, a sixth channel C6, and the sixth drain electrode D6. The sixth source electrode S6 is connected to the first drain electrode D1 of the first thin film transistor T1, and the sixth drain electrode D6 is connected to the first electrode PE1 of the OLED through a first auxiliary electrode AE1, a second auxiliary electrode AE2, and a plurality of contact holes CNT (right side contact holes in FIG. 5). The sixth channel C6, which is a channel area of the sixth active layer A6 overlapping the sixth gate electrode G6, is located between the sixth source electrode S6 and the sixth drain electrode D6. In other words, the sixth active layer A6 is connected between the first active layer A1 and the first electrode PE1 of the OLED.

The sixth channel C6 of the sixth active layer A6 may be channel-doped with N-type impurities or P-type impurities. Each of the sixth source electrode S6 and the sixth drain electrode D6 may be spaced apart from each other with the sixth channel C6 therebetween. Each of the sixth source electrode S6 and the sixth drain electrode D6 may be doped with doping impurities having a type opposite to a type of doping impurities used to dope the sixth channel C6. The sixth active layer A6 is located on a layer substantially the same as a layer on which the first active layer A1, the second active layer A2, the third active layer A3, the fourth active layer A4, and the fifth active layer A5 are located, includes a material substantially the same as a material included in the first active layer A1, the second active layer A2, the third active layer A3, the fourth active layer A4, and the fifth active layer A5, and is formed unitarily with the first active layer A1, the second active layer A2, the third active layer A3, the fourth active layer A4, and the fifth active layer A5.

The sixth gate electrode G6 is located on the sixth channel C6 of the sixth active layer A6 and is formed unitarily with the emission control line EM.

The seventh thin film transistor T7 is located on the substrate 111 and includes a seventh active layer A7 and the seventh gate electrode G7.

The seventh active layer A7 includes the seventh source electrode S7, a seventh channel C7, and the seventh drain electrode D7. The seventh source electrode S7 is connected to a first electrode PE1 of an OLED of another pixel that is not illustrated in FIG. 4 (e.g., a pixel located above the pixel PX illustrated in FIG. 4). The seventh drain electrode D7 is connected to the fourth source electrode S4 of the fourth thin film transistor T4. The seventh channel C7, which is a channel area of the seventh active layer A7 overlapping the seventh gate electrode G7, is located between the seventh source electrode S7 and the seventh drain electrode D7. In other words, the seventh active layer A7 is connected between the first electrode PE1 of the OLED of the another pixel and the fourth active layer A4.

The seventh channel C7 of the seventh active layer A7 may be channel-doped with N-type impurities or P-type impurities. Each of the seventh source electrode S7 and the seventh drain electrode D7 may be spaced apart from each other with the seventh channel C7 therebetween. Each of the seventh source electrode S7 and the seventh drain electrode D7 may be doped with doping impurities having a type opposite to a type of doping impurities used to dope the seventh channel C7. The seventh active layer A7 is located on a layer substantially the same as a layer on which the first active layer A1, the second active layer A2, the third active layer A3, the fourth active layer A4, the fifth active layer A5, and the sixth active layer A6 are located, includes a material substantially the same as a material included in the first active layer A1, the second active layer A2, the third active layer A3, the fourth active layer A4, the fifth active layer A5, and the sixth active layer A6, and is formed unitarily with the first active layer A1, the second active layer A2, the third active layer A3, the fourth active layer A4, the fifth active layer A5, and the sixth active layer A6.

The seventh gate electrode G7 is located on the seventh channel C7 of the seventh active layer A7 and is formed unitarily with the third gate line SLn-2.

The first active layer A1 of the first thin film transistor T1, the second active layer A2 of the second thin film transistor T2, the third active layer A3 of the third thin film transistor T3, the fourth active layer A4 of the thin film transistor T4, the fifth active layer A5 of the fifth thin film transistor T5, the sixth active layer A6 of the sixth thin film transistor T6, and the seventh active layer A7 of the seventh transistor T7 are connected to each other.

A first insulating layer IL1, a second insulating layer IL2, and a third insulating layer IL3 are sequentially stacked on the first active layer A1, the second active layer A2, the third active layer A3, the fourth active layer A4, the fifth active layer A5, the sixth active layer A6, and the seventh active layer A7. Each of the first insulating layer IL1, the second insulating layer IL2, and the third insulating layer IL3 may be an organic insulating layer or an inorganic insulating layer such as silicon nitride or silicon oxide. In addition, each of the insulating layers may be formed as a single layer or multiple layers. The plurality of contact holes CNT may be selectively defined in each of the first insulating layer IL1, the second insulating layer IL2, and the third insulating layer IL3. The first insulating layer IL1 contacts each of the first active layer A1, the second active layer A2, the third active layer A3, the fourth active layer A4, the fifth active layer A5, the sixth active layer A6, and the seventh active layer A7.

The first gate line SLn is located on the second active layer A2 and the third active layer A3 and extends in one direction crossing the second active layer A2 and the third active layer A3. In addition, the first gate line SLn is formed unitarily with the second gate electrode G2 and the third gate electrode G3 to be connected to the second gate electrode G2 and the third gate electrode G3.

The second gate line SLn-1 is spaced apart from the first gate line SLn, is located on the fourth active layer A4, extends in one direction crossing the fourth active layer A4, and is formed unitarily with the fourth gate electrode G4 to be connected to the fourth gate electrode G4.

The third gate line SLn-2 is spaced apart from the second gate line SLn-1, is located on the seventh active layer A7, extends in one direction crossing the seventh active layer A7, and is formed unitarily with the seventh gate electrode G7 to be connected to the seventh gate electrode G7.

The emission control line EM is spaced apart from the first gate line SLn, is located on the fifth active layer A5 and the sixth active layer A6, extends in one direction crossing the fifth active layer A5 and the sixth active layer A6, and is formed unitarily with the fifth gate electrode G5 and the sixth gate electrode G6 to be connected to the fifth gate electrode G5 and the sixth gate electrode G6.

The emission control line EM, the third gate line SLn-2, the second gate line SLn-1, the first gate line SLn, the first gate electrode G1, the second gate electrode G2, the third gate electrode G3, the fourth gate electrode G4, the fifth gate electrode G5, the sixth gate electrode G6, and the seventh gate electrode G7 described above are located on substantially the same layer and include substantially the same material. However, exemplary embodiments of the present invention are not limited thereto, and each of the emission control line EM, the third gate line SLn-2, the second gate line SLn-1, the first gate line SLn, the first gate electrode G1, the second gate electrode G2, the third gate electrode G3, the fourth gate electrode G4, the fifth gate electrode G5, the sixth gate electrode G6, and the seventh gate electrode G7 may be selectively formed on layers different from each other and include materials different from each other.

The capacitor Cst includes the first electrode CE1 and the second electrode CE2 which face each other with an insulating layer therebetween. In the present exemplary embodiment, the second electrode CE2 may be the first gate electrode G1. The first electrode CE1 of the capacitor Cst is located on the first gate electrode G1 and is connected to the common power line PL through one of the contact holes CNT (middle contact hole in FIG. 5).

The first electrode CE1 of the capacitor Cst forms the capacitor Cst together with the first gate electrode G1. The first gate electrode G1 and the first electrode CE1 of the capacitor Cst may be located on layers different from each other, and may include substantially the same metal as each other or metals different from each other.

The first electrode CE1 of the capacitor Cst includes an opening OA which exposes a portion of the first gate electrode G1 therethrough, and the gate bridge GB is connected to the first gate electrode G1 through the opening OA.

The data line DL is located on the first gate line SLn, extends in a direction crossing the first gate line SLn, and is connected to the second source electrode S2 of the second active layer A2 through one of the contact holes CNT. The data line DL extends to cross the first gate line SLn, the second gate line SLn-1, the third gate line SL-2, and the emission control line EM.

The gate bridge GB is located on the first gate line SLn, is spaced apart from the common power line PL, and is electrically connected to each of the third drain electrode D3 of the third active layer A3 and the fourth drain electrode D4 of the fourth active layer A4 through one of the contact holes CNT. In addition, the gate bridge GB is connected to the first gate electrode G1.

The common power line PL is spaced apart from the data line DL, is located on the first gate line SLn, and extends in a direction crossing the first gate line SLn. In other words, the common power line PL extends to cross the first gate line SLn, the second gate line SLn-1, the third gate line SLn-2, and the emission control line EM.

The common power line PL is connected to the OLED through at least one thin film transistor. Referring to FIGS. 4 and 5, the common power line PL is connected to the first electrode CE1 of the capacitor Cst and the fifth source electrode S5 of the fifth active layer A5, connected to the first active layer A1, through one of the contact holes CNT.

According to an exemplary embodiment of the present invention, the common power line PL has a multilayer structure. Referring to FIG. 5, the common power line PL has a double-layer structure. However, exemplary embodiments of the present invention are not limited to FIG. 5, and the common power line PL may have a single-layer structure or a structure including three or more-layers.

According to an exemplary embodiment of the present invention, the common power line PL includes a first power line PL1 and a second power line PL2 overlapping the first power line PL. In addition, the pixel PX includes a first organic layer 211 between the first power line PL1 and the second power line PL2. The first power line PL1 and the second power line PL2 contact each other through the contact hole CNT in the first organic layer 211.

Since the common power line PL has a multilayer structure, current and power supply through the common power line PL may become smooth. Accordingly, a voltage drop (e.g., an IR drop) may be substantially prevented, and the OLED display device 101 may have excellent luminous efficiency and high luminance. In particular, the voltage drop (e.g., an IR drop) is substantially prevented in a large-sized OLED display device 101, and the display quality of the OLED display device 101 having a large size is increased. In addition, according to an exemplary embodiment of the present invention, since a reaction speed of the OLED is increased, and a line width of the common power line PL is reduced, the high resolution OLED display device 101 may have a high luminance.

A second organic layer 212 is disposed on the second power line PL2. The second organic layer 212 may serve as an insulating layer and a planarization layer.

The data line DL, the first power line PL1 of the common power line PL, and the gate bridge GB are located on substantially the same layer and include substantially the same material. In an exemplary embodiment of the present invention, each of the data line DL, the common power line PL, and the gate bridge GB may be selectively formed on layers different from each other and include materials different from each other.

The initialization line RL is located on the second gate line SLn-1 and is connected to the fourth source electrode S4 of the fourth active layer A4 through one of the contact holes CNT. The initialization line RL may be formed on a layer substantially the same as a layer on which the first electrode PE1 of the OLED is formed and may include substantially the same material. In another exemplary embodiment of the present invention, the initialization line RL and the first electrode PE1 may be located on layers different from each other and may include materials different from each other.

A pixel defining layer 290 has an opening and the first electrode PE1 of the OLED is exposed from the pixel defining layer 290 through the opening. The pixel defining layer 290 may define a light emitting area of the OLED.

The OLED includes the first electrode PE1, the organic light emitting layer OL, and the second electrode PE2. The first electrode PE1 is connected to the sixth drain electrode D6 of the sixth thin film transistor T6 through the first auxiliary electrode AE1, the second auxiliary electrode AE2 and the plurality of contact holes CNT.

In the present exemplary embodiment, the first auxiliary electrode AE1 and the second auxiliary electrode AE2 overlap each other, and the first organic layer 211 is disposed between the first auxiliary electrode AE1 and the second auxiliary electrode AE2. The first auxiliary electrode AE1 is located on a layer the same as a layer on which the data line DL, the first power line PL1 of the common power line PL, and the gate bridge GB are formed and includes a material substantially the same as a material included in the data line DL, the first power line PL1 of the common power line PL, and the gate bridge GB. The second auxiliary electrode AE2 and the second power line PL2 are located on substantially the same layer and include substantially the same material.

The organic light emitting layer OL is located between the first electrode PE1 and the second electrode PE2. The second electrode PE2 is located on the organic light emitting layer OL. One of the first electrode PE1 and the second electrode PE2 may have light transmittance. A light emitted from the organic light emitting layer OL may be emitted in a direction toward at least one of the first electrode PE1 and the second electrode PE2.

In addition, a capping layer covering the OLED may be disposed on the OLED. In addition, a thin film encapsulation layer may be disposed on the OLED, or an encapsulation substrate may be disposed thereon.

Figure 6:
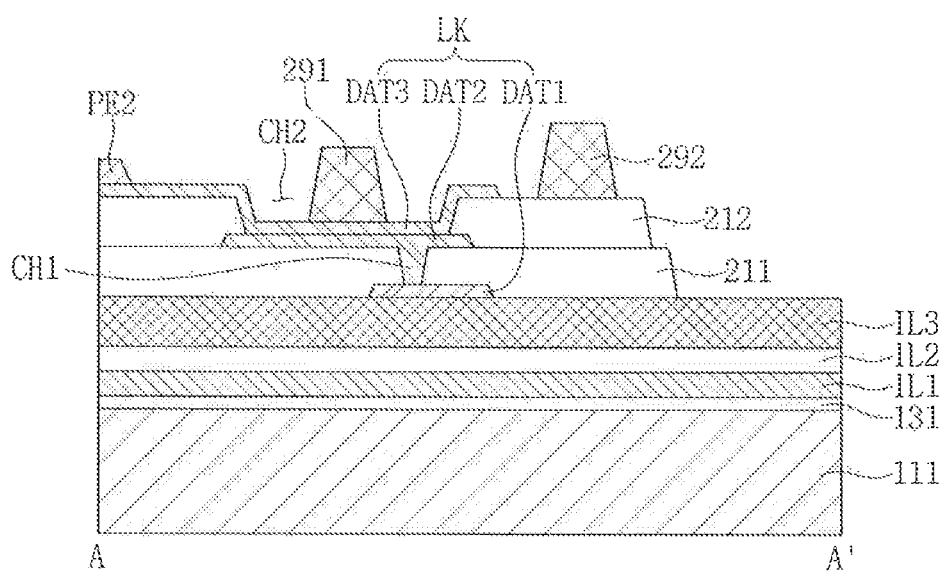
FIG. 6 is a cross-sectional view taken along line A-A' of FIG. 1.

FIG. 6 is a cross-sectional view taken along the line A-A' of FIG. 1. In other words, FIG. 6 is a cross-sectional view illustrating a part of the non-display area of the OLED display device 101 according to an exemplary embodiment of the present invention.

Referring to FIGS. 1 and 6, the OLED display device 101 according to the present exemplary embodiment includes the link line LK disposed at the non-display area NDA of the substrate 111. The link line LK is connected to the second electrode PE2 extending from the display area DPA to the non-display area NDA, and the second electrode PE2 receives the second voltage ELVSS through the link line LK at the non-display area NDA. The link line LK may overlap at least a portion of the second electrode PE2. The link line LK according to the present exemplary embodiment is depicted as extending in the first direction DR1 in the non-display area NDA, but the present invention is not limited thereto. For example, the link line LK may be arranged in various forms to be connected to the second electrode PE2.

The link line LK according to the present exemplary embodiment has a multilayer structure. For example, the link line LK has a triple-layer structure including a first conductive line DAT1, a second conductive line DAT2, and a third conductive line DAT3 which overlap each other with the insulating layers 211 and 212 therebetween. The insulating layers 211 and 212 may include the first organic layer 211 between the first conductive line DAT1 and the second conductive line DAT2 and the second organic layer 212 between the second conductive line DAT2 and the third conductive line DAT3.

The first conductive line DAT1 and the second conductive line DAT2 contact each other through a first contact hole CH1, and the second conductive line DAT2 and the third conductive line DAT3 contact each other through a second contact hole CH2. In addition, at least one of the first, second, and third conductive lines DAT1, DAT2, and DAT3 may form a closed loop shape surrounding the display area DPA on a plane. For example, the first conductive line DAT1, the second conductive line DAT2, and the third conductive line DAT3 may form a closed loop shape surrounding the display area DPA on a plane. According to this configuration, it is possible to substantially prevent impurities such as moisture from penetrating through a side surface of the first organic layer 211.

Since the OLED display device 101 according to the present exemplary embodiment includes a triple-layered link line LK including the first, second, and third conductive lines DAT1, DAT2, and DAT3 overlapping each other, the second voltage ELVSS supplied through the link line LK may be smooth. In addition, since the voltage drop (e.g., IR drop) is substantially prevented, a display quality of the OLED display device 101 may be increased. In addition, since a line width of the link line LK may be reduced, a planar area of the non-display area NDA may be reduced.

In addition, as illustrated in FIG. 6, a plurality of spacers 291 and 292 may be disposed on the third conductive line DAT3 and the second organic layer 212, respectively. However, exemplary embodiments of the present invention are not limited thereto, and the spacers 291 and 292 may be omitted.

Figure 7:
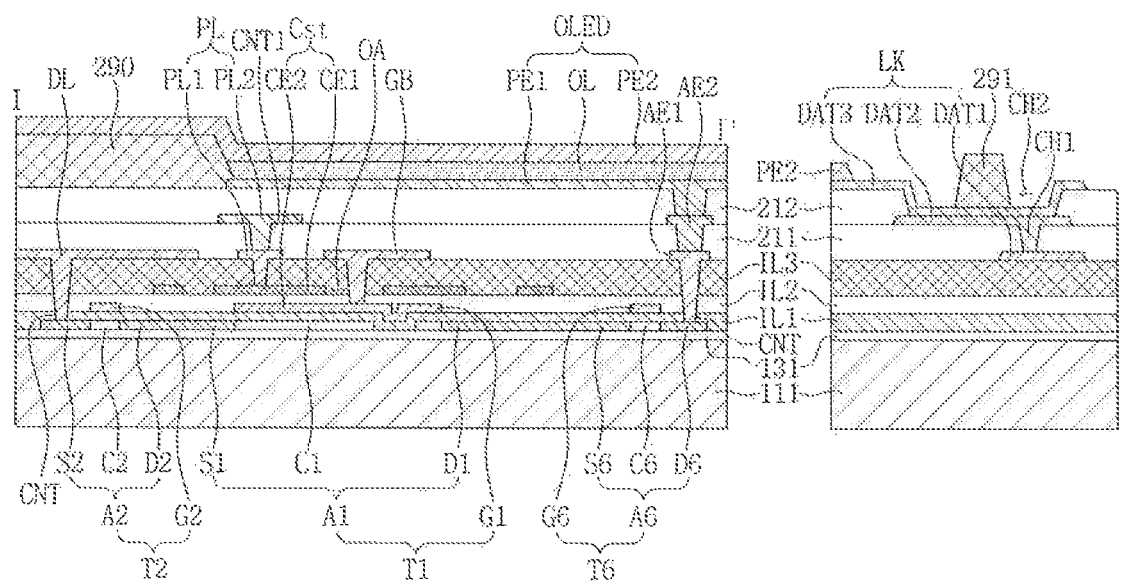
FIG. 7 is a view comparing the cross-sectional view of FIG. 5 and the cross-sectional view of FIG. 6.

FIG. 7 is a view comparing the cross-sectional view of FIG. 5 and the cross-sectional view of FIG. 6.

Referring to FIG. 7, the first electrode PE1 at the display area DPA of the OLED display device 101 overlaps the first auxiliary electrode AE1 and the second auxiliary electrode AE2, and the first electrode PE1 is connected to the sixth drain electrode D6 through the first auxiliary electrode AE1 and the second auxiliary electrode AE2.

In addition, the link line LK at the non-display area NDA has a triple-layer structure including the first conductive line DAT1, the second conductive line DAT2, and the third conductive line DAT3, and is connected to the second electrode PE2. In other words, the second electrode PE2 receives the second voltage ELVSS through the link line LK.

In the present exemplary embodiment, the first conductive line DAT1 of the link line LK is located on a layer substantially the same as a layer on which the first auxiliary electrode AE1 is located, and may include a material substantially the same as a material included in the first auxiliary electrode PE1. In addition, the second conductive line DAT2 of the link line LK is located on a layer substantially the same as a layer on which the second auxiliary electrode AE2 is located, and may include a material substantially the same as a material included in the second auxiliary electrode PE2. In addition, the third conductive line DAT3 of the link line LK is located on a layer substantially the same as a layer on which the first electrode PE1 is located, and may include a material substantially the same as a material included in the first electrode PE1.

The spacer 291 is disposed on the third conductive line DAT3 of the link line LK. The spacer 291 and the pixel defining layer 290 may include substantially the same material and may be manufactured substantially simultaneously in substantially the same process. For example, the pixel defining layer 290 and the spacer 291 may be formed using an exposure mask, and heights of the pixel defining layer 290 and the spacer 291 may be adjusted by adjusting light transmittance of the mask.

Hereinafter, another exemplary embodiment of the present invention will be described with reference to FIG. 8. Configurations and elements identical to those already described in prior embodiments will be omitted from the following description of FIG. 8.

Figure 8:
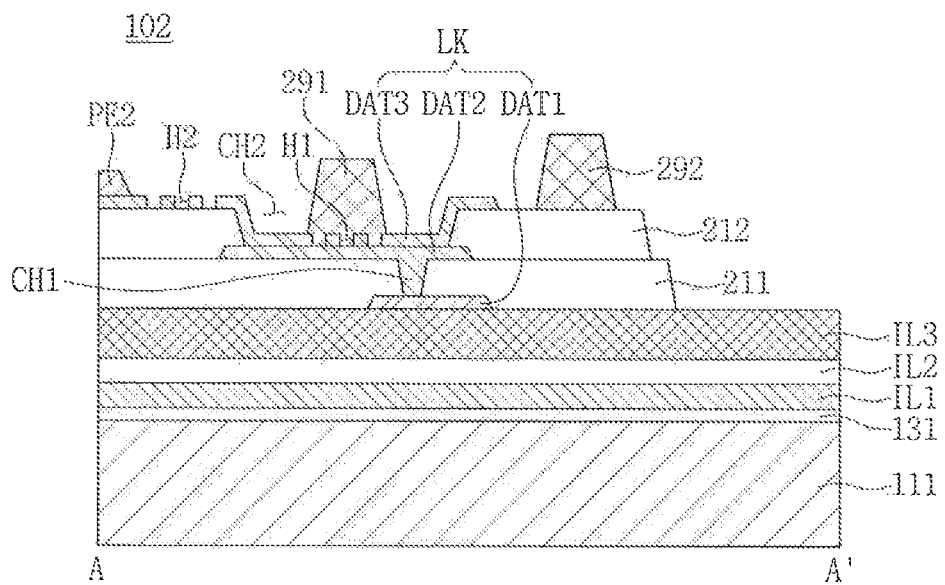
FIG. 8 is a cross-sectional view taken along the line A-A' of FIG. 1 according to another exemplary embodiment of the present invention.

FIG. 8 is a cross-sectional view taken along the line A-A' of FIG. 1 according to another exemplary embodiment of the present invention. In other words, FIG. 8 is a cross-sectional view illustrating a part of a non-display area NDA of an OLED display device 102 according to another exemplary embodiment of the present invention.

Referring to FIG. 8, a third conductive line DAT3 of a link line LK according to another exemplary embodiment of the present invention includes a plurality of first holes H1 between a second conductive line DAT2 and a spacer 291, and has a plurality of second holes H2 at an area overlapping a first organic layer 211 and a second organic layer 212. The plurality of first holes H1 and the plurality of second holes H2 may each have a diameter in a range from about 1 μm to about 5 μm.

Moisture, oxygen, or the like may be generated by a heat treatment when organic layers such as the first organic layer 211, the second organic layer 212, and the spacer 291 are formed. The generated moisture or oxygen may not escape to the outside and may remain in the organic layer. Therefore, a metal may be contaminated or oxidized by the remaining moisture or oxygen, and patterning failure may occur.

Accordingly, when the third conductive line DAT3 of the link line LK has the plurality of first holes H1 and the plurality of second holes H2 at an area overlapping the first organic layer 211, the second organic layer 212, and the spacer 291, moisture or oxygen generated during the heat treatment process may escape to the outside. Accordingly, reliability of the OLED display device 102 may be increased.

Hereinafter, still another exemplary embodiment of the present invention will be described with reference to FIG. 9. Configurations and elements identical to those already described in prior embodiments will be omitted from the following description of FIG. 9.

Figure 9:
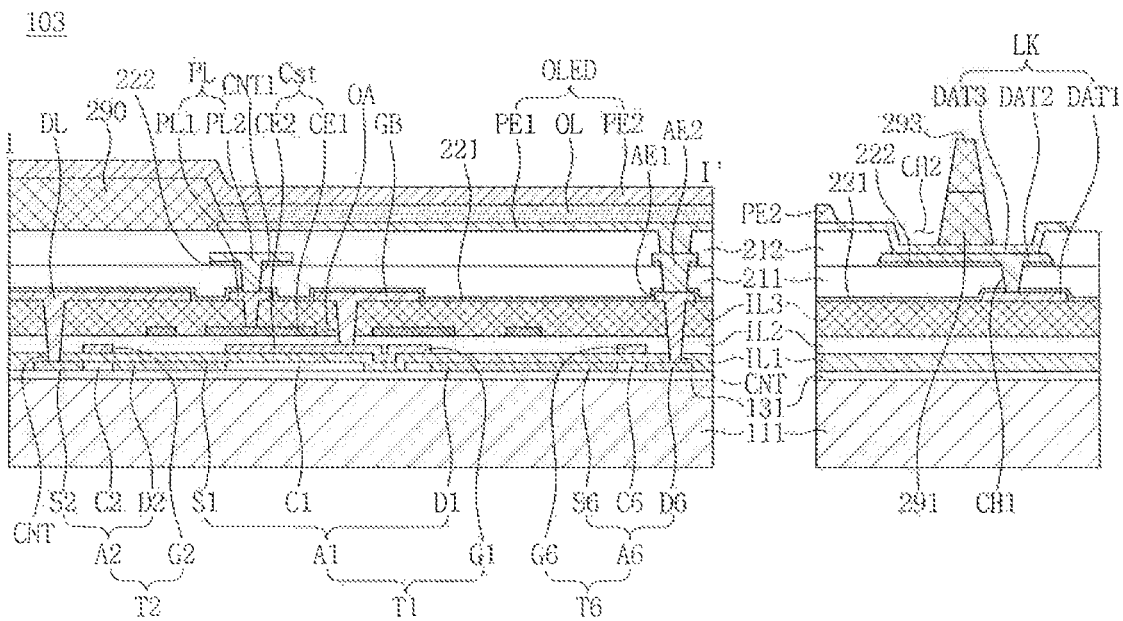
FIG. 9 is a cross-sectional view illustrating an OLED display device according to still another exemplary embodiment of the present invention.

FIG. 9 is a cross-sectional view illustrating an OLED display device 103 according to still another exemplary embodiment of the present invention.

Referring to FIG. 9, the OLED display device 103 according to still another exemplary embodiment of the present invention includes a first organic layer 211, and further includes a first inorganic layer 221 and a second inorganic layer 222 each overlapping the first organic layer 211.

Each of a first power line PL1 and a second power line PL2 constituting a common power line PL; a first auxiliary electrode AE1 and a second auxiliary electrode AE2 connected to a first electrode PE1; a first conductive line DAT1 and a second conductive line DAT2 constituting a link line LK may include a metal. When this metal is disposed directly on the first organic layer 211, the metal may be oxidized by the influence of moisture or oxygen remaining in the first organic layer 211. In the case when the metal is oxidized, accurate patterning may not be achieved in an etching process (e.g., a dry etching process), and impurities may remain on the first organic layer 211 after patterning. Such impurities may cause defective products.

According to the exemplary embodiment of FIG. 9, the first inorganic layer 221 is disposed between the first organic layer 211 and a metal layer including a data line DL, the first power line PL1, a gate bridge GB, the first auxiliary electrode AE1, and the first conductive line DAT1. In addition, the second inorganic layer 222 is disposed between the first organic layer 211 and a metal layer including the second power line PL2, the second auxiliary electrode AE2, and the second conductive line DAT2. Accordingly, patterning failure may be substantially prevented in the process of forming the plurality of metal layers.

In addition, the OLED display device 103 according to the exemplary embodiment of FIG. 9 may include spacers 291 and 293 having a multi-layer structure. In other words, to increase spacer height, the spacers 291 and 293 may be stacked.

Hereinafter, yet another exemplary embodiment of the present invention will be described with reference to FIG. 10. Configurations and elements identical to those already described in prior embodiments will be omitted from the following description of FIG. 10.

Figure 10:
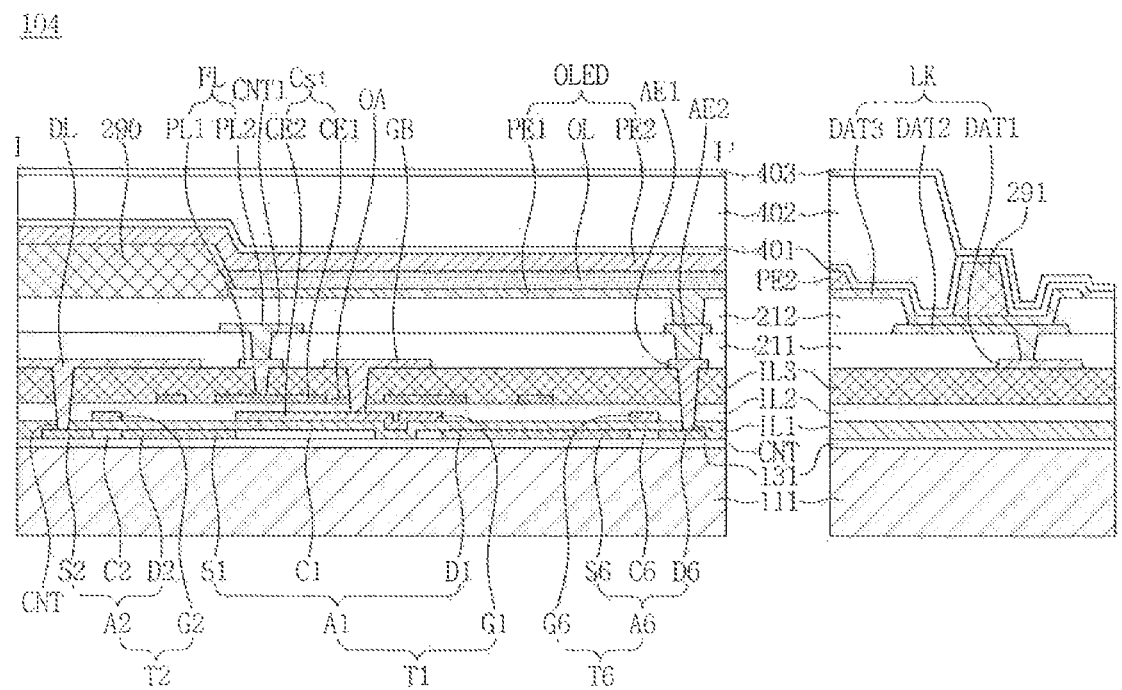
FIG. 10 is a cross-sectional view illustrating an OLED display device according to yet another exemplary embodiment of the present invention.

FIG. 10 is a cross-sectional view illustrating an OLED display device 104 according to yet another exemplary embodiment of the present invention.

Referring to FIG. 10, the OLED display device 104 according to yet another exemplary embodiment of the present invention further includes thin film encapsulation layers 401, 402, and 403 disposed on a second electrode PE2 and a link line LK. The thin film encapsulation layers 401, 402 and 403 may also be disposed on a spacer 291 and a second organic layer 212, for example.

The thin film encapsulation layers 401, 402, and 403 may include one or more inorganic layers 401 and 403 and one or more organic layers 402. In addition, the thin film encapsulation layers 401, 402, and 403 may have a structure in which the inorganic layers 401 and 403 and the organic layer 402 are alternately stacked. In the present exemplary embodiment, the inorganic layer 401 is located at a lowermost portion of the encapsulation layers 401, 402 and 403. In other words, of the encapsulation layers 401, 402 and 403, the inorganic layer 401 is located closest to the OLED. Although the thin film encapsulation layers 401, 402, and 403 according to the present exemplary embodiment are depicted as including two inorganic layers 401 and 403 and one organic layer 402, the present invention is not limited thereto. For example, the thin film encapsulation layers 401, 402 and 403 may include one inorganic layer and two organic layers.

The inorganic layers 401 and 403 include one or more inorganic materials consisting of: $Al_2O_3$, $TiO_2$, $ZrO$, $SiO_2$, AlON, AlN, SiON, $Si_3N4$, ZnO, and $Ta_2O_5$. The inorganic layers 401 and 403 may be formed through methods such as chemical vapor deposition (CVD) or atomic layer deposition (ALD). However, exemplary embodiments of the present invention are not limited thereto, and the inorganic layers 401 and 403 may be formed using various other methods.

The organic layer 402 may include a polymer-based material. Examples of the polymer-based material may include, for example, an acrylic resin, an epoxy resin, polyimide and polyethylene. In addition, the organic layer 402 may be formed through a thermal deposition process. The thermal deposition process for forming the organic layer 402 may be performed in a temperature range that may not damage the OLED. However, exemplary embodiments of the present invention are not limited thereto and the organic layer 402 may be formed using various other methods.

The inorganic layers 401 and 403, which have a high density thin film, may largely prevent or reduce infiltration of moisture or oxygen. In other words, permeation of moisture and oxygen into the OLED may be largely prevented by the inorganic layers 401 and 403.

The thin film encapsulation layers 401, 402, and 403 may have a thickness less than or equal to about 10 μm. Accordingly, an overall thickness of a display panel may be thin. Since the thin film encapsulation layers 401, 402, and 403 are used, the display panel may become more flexible.

As set forth hereinabove, the OLED display devices according to one or more exemplary embodiments of the present invention include a multi-layer structured link line at a non-display area, and thus, excellent display quality may be achieved and a planar area of the non-display area may be reduced. In addition, as a substrate is bent to be disposed on a back surface of a display area, a narrow bezel may be provided.

While the present invention has been illustrated and described with reference to the exemplary embodiments thereof, it will be apparent to those of ordinary skill in the art that various changes in form and detail may be made thereto without departing from the spirit and scope of the present invention as defined by the following claims.

What is claimed is:

1. An organic light emitting display device, comprising:
   a substrate comprising a display area and a non-display area;
   an organic light emitting element comprising a first electrode, an organic light emitting layer (OL) over the first electrode, and a second electrode over the organic light emitting layer, wherein the first electrode is at the display area of the substrate;
   a gate line and a data line on the substrate;
   a thin film transistor connected to the gate line and the data line;
   an insulating layer over the thin film transistor;
   a first conductive line on the insulating layer at the non-display area of the substrate;
   a first organic layer on the first conductive line; and
   a second conductive line, wherein at least a part of the second conductive line is on the first organic layer and connected to the first conductive line,
   wherein the second conductive line is connected to the second electrode,
   wherein the first organic layer has a contact hole, and
   the second conductive line is connected to the first conductive line through the contact hole.

2. The organic light emitting display device of claim 1, wherein the first conductive line and the second conductive line constitute a link line.

3. The organic light emitting display device of claim 1, the second conductive line is at the non-display area of the substrate.

4. An organic light emitting display device, comprising:
   a substrate comprising a display area and a non-display area;
   an organic light emitting element comprising a first electrode, an organic light emitting layer (OL) over the first electrode, and a second electrode over the organic light emitting layer, wherein the first electrode is at the display area of the substrate;
   a gate line and a data line on the substrate;
   a thin film transistor connected to the gate line and the data line;
   an insulating layer over the thin film transistor;
   a first conductive line on the insulating layer at the non-display area of the substrate;
   a first organic layer on the first conductive line; and
   a second conductive line, wherein a part of the second conductive line is on the first organic layer and connected to the first conductive line,
   the organic light emitting display device further comprising a second organic layer;

a third conductive line on the first organic layer and connected to the second conductive line through a contact hole in the second organic layer, wherein the third conductive line is connected to the second electrode.

5. The organic light emitting display device of claim 4, further comprising a spacer on the third conductive line.

6. The organic light emitting display device of claim 5, wherein the spacer comprises a plurality of layers.

7. The organic light emitting display device of claim 6, wherein the third conductive line has a plurality of holes at an area between the second conductive line and the spacer.

8. The organic light emitting display device of claim 7, wherein each of the plurality of holes has a diameter from about 1 82 m to about 5 μm.

9. The organic light emitting display device of claim 4, wherein the third conductive line has a plurality of holes at an area overlapping the first organic layer and the second organic layer.

10. The organic light emitting display device of claim 9, wherein each of the plurality of holes has a diameter from about 1 μm to about 5 μm.

11. The organic light emitting display device of claim 1, further comprising a spacer on the second conductive line.

12. The organic light emitting display device of claim 1, further comprising an inorganic layer between the first conductive line and the first organic layer.

13. The organic light emitting display device of claim 1, further comprising an inorganic layer between the first organic layer and the second conductive line.

14. An organic light emitting display device, comprising:
a substrate comprising a display area and a non-display area;
an organic light emitting element comprising a first electrode, an organic light emitting layer (OL) over the first electrode, and a second electrode over the organic light emitting layer, wherein the first electrode is at the display area of the substrate;
a gate line and a data line on the substrate;
a first thin film transistor connected to the gate line and the data line;
an insulating layer over the first thin film transistor;
a first conductive line on the insulating layer at the non-display area of the substrate;
a first organic layer on the first conductive line; and
a second conductive line, wherein at least a part of the second conductive line is on the first organic layer and connected to the first conductive line,
wherein the second conductive line is connected to the second electrode,
the organic light emitting display device further comprising:
a second thin film transistor connected to the gate line and the data line;
a first auxiliary electrode overlapping the second thin film transistor and connected to the second thin film transistor; and
a second auxiliary electrode between the first auxiliary electrode and the first electrode, wherein the second auxiliary electrode is connected to each of the first auxiliary electrode and the first electrode.

15. The organic light emitting display device of claim 14, wherein the first conductive line and the first auxiliary electrode are disposed on the same layer.

16. The organic light emitting display device of claim 14, further comprising a common power line parallel to the data line, wherein the common power line comprises a first power line and a second power line.

17. The organic light emitting display device of claim 14, wherein the first power line, the first conductive line and the first auxiliary electrode are disposed on the same layer, and the second power line, the second conductive line and the second auxiliary electrode are disposed on the same layer.

18. The organic light emitting display device of claim 1, further comprising a thin film encapsulation layer on the second electrode and the second conductive line,
wherein the thin film encapsulation layer comprises: an inorganic layer; and an organic layer.

19. The organic light emitting display device of claim 1, wherein the substrate comprises a bendable portion.

* * * * *